US008612922B2

(12) United States Patent
Arsintescu

(10) Patent No.: US 8,612,922 B2
(45) Date of Patent: Dec. 17, 2013

(54) GENERALIZED CONSTRAINT COLLECTION MANAGEMENT METHOD

(75) Inventor: George B. Arsintescu, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 866 days.

(21) Appl. No.: 12/323,042

(22) Filed: Nov. 25, 2008

(65) Prior Publication Data

US 2009/0077513 A1 Mar. 19, 2009

Related U.S. Application Data

(62) Division of application No. 11/527,199, filed on Sep. 25, 2006, now Pat. No. 7,802,222.

(51) Int. Cl.
*G06F 17/50* (2006.01)

(52) U.S. Cl.
USPC ........... 716/139; 716/100; 716/102; 716/103; 716/104; 716/108; 716/110; 716/111; 716/112; 716/122; 716/123; 716/137

(58) Field of Classification Search
USPC ......... 716/100, 102–104, 108, 110–112, 122, 716/123, 137, 139
See application file for complete search history.

(56) References Cited

U.S. PATENT DOCUMENTS

| | | | |
|---|---|---|---|
| 5,999,911 A | | 12/1999 | Berg et al. |
| 6,209,123 B1 * | | 3/2001 | Maziasz et al. ............... 716/123 |
| 6,230,066 B1 * | | 5/2001 | Sferro et al. ................. 700/104 |
| 6,446,239 B1 * | | 9/2002 | Markosian et al. ........... 716/122 |
| 6,449,761 B1 * | | 9/2002 | Greidinger et al. .......... 716/122 |
| 6,530,073 B2 | | 3/2003 | Morgan |
| 6,651,222 B2 * | | 11/2003 | Gupta et al. .................. 716/102 |
| 6,658,628 B1 * | | 12/2003 | Landy et al. .................. 716/103 |
| 6,697,880 B1 * | | 2/2004 | Dougherty .................... 719/320 |
| 6,877,139 B2 * | | 4/2005 | Daga ............................. 716/108 |
| 7,003,749 B2 * | | 2/2006 | Subasic et al. ................ 716/122 |

(Continued)

FOREIGN PATENT DOCUMENTS

WO  WO-2008039706 A2  4/2008

OTHER PUBLICATIONS

U.S. Appl. No. 12/323,118, Final Office Action mailed Oct. 12, 2011, 8 pgs.

(Continued)

*Primary Examiner* — Helen Rossoshek
(74) *Attorney, Agent, or Firm* — Kenyon & Kenyon LLP

(57) ABSTRACT

Techniques are provided to allow users of Electronic Design Automation (EDA) tools to define constraint template types for efficiently associating constraints with design objects to specify design intent. Processes for creating and validating the constraints are provided by user-defined plug-ins, thereby allowing users to annotate circuit designs with constraints for proprietary layout and fabrication processes without exposing the constraints to tool vendors or competitors. The constraints are re-created from the template types whenever the circuit design is loaded into the EDA tool, so that the constraints are based upon the latest version of the template type. The constraints are also re-created when validation fails. Constraint groups are reusable in different designs, technology nodes, and processes because they automatically expand to provide the specific constraints to achieve a goal. The specific constraints in a template type can be modified as technology changes, and the modification will automatically be applied to the design objects.

10 Claims, 12 Drawing Sheets

(56) References Cited

U.S. PATENT DOCUMENTS

| | | | |
|---|---|---|---|
| 7,117,467 B2* | 10/2006 | Ali et al. | 716/122 |
| 7,243,314 B2* | 7/2007 | Ting | 716/111 |
| 7,322,019 B2* | 1/2008 | Sato et al. | 716/112 |
| 7,353,488 B1* | 4/2008 | Coffin et al. | 716/104 |
| 7,386,585 B2* | 6/2008 | Agrawal et al. | 709/200 |
| 7,475,000 B2 | 1/2009 | Cook et al. | |
| 7,506,277 B1 | 3/2009 | Arora et al. | |
| 7,539,966 B2* | 5/2009 | Basu et al. | 716/119 |
| 7,546,571 B2* | 6/2009 | Mankin et al. | 716/137 |
| 7,669,155 B2 | 2/2010 | Ganesan et al. | |
| 7,802,222 B2 | 9/2010 | Arsintescu | |
| 2002/0133784 A1* | 9/2002 | Gupta et al. | 716/1 |
| 2004/0205573 A1 | 10/2004 | Carlson et al. | |
| 2005/0222827 A1* | 10/2005 | Emek et al. | 703/2 |
| 2006/0095885 A1* | 5/2006 | Agrawal et al. | 716/12 |
| 2006/0101368 A1 | 5/2006 | Kesarwani et al. | |
| 2006/0218513 A1* | 9/2006 | Dozorets et al. | 716/5 |
| 2006/0277006 A1* | 12/2006 | Musharbash | 703/1 |
| 2007/0198959 A1* | 8/2007 | Schubert et al. | 716/4 |
| 2008/0077901 A1 | 3/2008 | Arsintescu | |
| 2009/0077505 A1* | 3/2009 | Arsintescu | 716/1 |
| 2009/0077513 A1* | 3/2009 | Arsintescu | 716/5 |
| 2009/0113369 A1* | 4/2009 | Colwell et al. | 716/11 |
| 2009/0307639 A1 | 12/2009 | Chapman et al. | |
| 2010/0325597 A1 | 12/2010 | Arsintescu | |

OTHER PUBLICATIONS

U.S. Appl. No. 12/323,118, Response filed Aug. 26, 2011 to Non Final Office Action mailed Mar. 28, 2011, 9 pgs.

"U.S. Appl. No. 11/527,199, Non Final Office Action mailed Jan. 26, 2009", 10 pgs.

"U.S. Appl. No. 11/527,199, Non Final Office Action mailed Dec. 3, 2009", 10 pgs.

"U.S. Appl. No. 11/527,199, Notice of Allowance mailed May 17, 2010", 9 pgs.

"U.S. Appl. No. 11/527,199, Response filed Mar. 3, 2010 to Non Final Office Action mailed Dec. 3, 2009", 16 pgs.

"U.S. Appl. No. 11/527,199, Response filed Apr. 30, 2009 to Non Final Office Action mailed Jan. 26, 2009", 15 pgs.

"U.S. Appl. No. 11/527,199, Response filed Nov. 21, 2008 to Restriction Requirement Sep. 10, 2008", 12 pgs.

"U.S. Appl. No. 11/527,199, Restriction Requirement mailed Sep. 10, 2008", 7 pgs.

"U.S. Appl. No. 12/323,118, Non Final Office Action mailed Mar. 28, 2011", 7 pgs.

"U.S. Appl. No. 12/873,112, Preliminary Amendment mailed Aug. 31, 2010", 3 pgs.

"International Application Serial No. PCT/US2007/079223, International Preliminary Report on Patentability mailed Mar. 31, 2009", 7 pgs.

"International Application Serial No. PCT/US2007/079223, International Search Report and Written Opinion mailed Apr. 1, 2008", 11 pgs.

"What's New in Board Station 2005", [Online], XP007904262 Retrieved from the Internet: URL: http://www.mentor.com/products/pcb/boardstation/upload/bs2005_wnandc_final.pdf> (retrieved on Mar. 6, 2008), (2006), 29-31.

* cited by examiner

GENERALIZED CONSTRAINT COLLECTION MANAGEMENT METHOD

CROSS-REFERENCE TO RELATED APPLICATION

This application is a divisional application of U.S. patent application Ser. No. 11/527,199 filed Sep. 25, 2006, which is incorporated in its entirety herein by this reference.

BACKGROUND OF THE INVENTION

1. Field of the Invention

The invention relates to the design of electronic circuits and more particularly to association of constraints with design objects in electronic circuit designs.

2. Description of the Related Art

Electronic Design Automation (EDA) tools are software programs that are used to design electronic circuits. A suite or combination of EDA tools may be used to convert a circuit design idea to a physical design including logic gates, circuit components, and their interconnections. A circuit designer typically uses an EDA tool to create a schematic design of a circuit. The designer may use another EDA tool from the suite to convert the schematic to a physical circuit layout, which includes the shapes, positions, and dimensions of semiconductor and conductor materials such as silicon and metal. The EDA design tool in essence translates the schematic design to a physical layout using layout rules, which specify, for example, that a particular type of transistor is to have particular dimensions and be a particular distance from other transistors in the physical layout. The physical layout can be fabricated to produce a physical implementation, which is typically a semiconductor chip.

The integrated circuit may be, for example, an analog circuit such as an amplifier, a digital circuit such as a microprocessor, or a combination analog and digital circuit, such as a cellular telephone radio. In one approach to circuit design, a designer creates the schematic diagram by adding design objects such as transistors, resistors, digital logic gates, and other devices to a design canvas. The designer connects the design objects using connections that are represented as lines in the schematic.

A design canvas is typically a two-dimensional area displayed by the EDA tool. The EDA tool may provide a user interface to allow the designer to modify the schematic design by modifying existing design objects on the canvas, by adding new design objects to the canvas, and by modifying or adding connections between the objects on the canvas. Some prior custom design tools allow the designer to produce "custom designs" by providing a selection of design objects that can be placed at locations on the canvas specified by the designer. Locations on the canvas may correspond to locations on the physical material on which the circuit is to be fabricated, thereby allowing the designer to control the placement of physical devices on the physical circuit.

Often, design annotations are used to communicate design intent among designers, and to archive design intent. A design annotation may include one or more data values such as parameter values for layout rules. The data values may be, for example, text in a format that is readable by humans or machines. A design annotation may also include one or more names associated with the data values, e.g., to identify specific parameters to which the data values correspond. Design annotations are typically created by a user via an EDA tool user interface or by a programmatic script, and are typically associated with particular design objects.

Annotations that can be recognized and used by the design tool or fabrication process are called "constraints". Constraint-driven design is a state-of-the-art technique for productivity enhancement in modern design automation software. A constraint is typically identified by a name, which is associated with an optional value, which may specify details about the constraint. A constraint can be attached to one or more design objects, typically by a designer who wishes to specify information about a design object for the purpose of, for example, overriding default layout parameters provided by the base EDA tool, or for providing additional layout or process parameters not provided by the base EDA tool. For example, a symmetry constraint may specify that two devices are to be positioned symmetrically in the physical layout. An orientation constraint may specify that a device is to be positioned with a particular orientation, where the orientation is specified by the value of the constraint. The design tool may recognize and act on the constraints when generating the layout. The constraint may also be used in the fabrication process when fabricating the physical circuit.

Designers typically enter constraints for a circuit into one or more EDA tools as part of the process of designing the circuit. However, as more constraint-driven algorithms become available, there is a corresponding increase in the number, complexity, and specialization of constraints that are available to the designer. Unfortunately, the designer's productivity can be impeded by time spent selecting and entering the appropriate constraints. Automated constraint entry techniques such as scripts and hard-coded entry of constraint groups have been developed to address this productivity impediment. Scripts have been used to generate the constraints automatically, e.g., by generating multiple constraints in response to one user action. However, the scripts often fail to accommodate continuous incremental changes to the constraints. Changes ordinarily must be made to the scripts over time in response to changes in the underlying technology that implements the circuit. Unfortunately, using existing change methodologies to change scripts can be error-prone, because, for example, an operator may enter incorrect constraints, or a script that generates constraints may contain an error that may introduce incorrect or inconsistent constraints.

Hard-coded entry of groups of constraints is another technique meant to address the productivity impediment. With this group-based approach, multiple constraints can be entered at once, e.g., in response to one user action, so the constraint entry process is somewhat simplified, but such techniques still require restarting the constraint entry task from scratch for new technology or new constraint driven tools and are, therefore, subject to technological obsolescence.

Users of the EDA tool may define constraints and associated instructions for creating the constraints, such as scripts or constraint groups. Such user-defined constraints are typically used by user-defined tools that interact with the EDA tool, such as tools for generating physical circuit layouts and tools for controlling the chip fabrication process. Different designs and different users may employ different specialized constraints to achieve design goals. The goals and the constraints used to achieve them may be proprietary. Therefore, there is a benefit to permitting users to define customized, specialized constraints without revealing such constraints to other parties, such as the EDA tool vendor, for example. Therefore, the constraints, associated instructions, and circuit designs that use the constraints should not ordinarily be accessible by other users, or by the EDA tool vendor, for example.

There has been a need for techniques of automatically creating constraints for a circuit design in an EDA tool while maintaining correctness of the constraints over time, e.g., as technology, the circuit design, and the EDA tool change. There also has been a need to enable users to extend the EDA tool to allow the tool to create and maintain constraints according to user-defined instructions. There has further been a need to allow users to protect their extensions, and circuit designs that use their extensions, from unauthorized use by other users. Therefore, it would be desirable to have a technique for automatic management of constraints that accommodates changes to the constraints and changes to the tools, and permits easy development of customized constraints while minimizing the risk of revealing proprietary information.

SUMMARY OF THE INVENTION

In general, in a first aspect, the invention features a method of automating the application of constraints to design objects in a circuit design created using an electronic design automation tool. The method comprises receiving selection of a circuit design object that represents a physical circuit object in a circuit being designed in the electronic design automation tool, receiving selection of a template type that produces a constraint that represents a physical limitation upon implementation of the circuit design object in the circuit, wherein the template type is represented in the electronic design automation tool by a selectable user interface feature, and producing a template instance based upon the template type, wherein the template instance associates the constraint with the circuit design object to represent in the electronic design automation tool that the physical limitation of the constraint applies to the circuit design object.

Embodiments of the invention may include one or more of the following features. Producing the template instance may include identifying a template instance generation process associated with the template type, invoking the generation process to create the template instance, and associating the circuit design object with the template instance. The template instance generation process may be provided by a user of the design automation tool. The method of automating the application of constraints may further comprise providing the design object and a template instance parameter to the template instance generation process. The template instance generation process may comprise creating the constraint; associating the parameter with the constraint, and associating the design object with the constraint.

The circuit design object may be stored in a circuit design file, wherein a representation of the template instance is stored to the circuit design file, and wherein the representation includes an instance name, a template type identifier that specifies the template instance's type, and a design object identifier that specifies the design object. The design automation tool may be stored in at least one tool file provided by a design automation tool vendor and the template instance's type may be stored in a template type plug-in file, wherein the at least one tool file, the template type plug-in file, and the circuit design file are separate files. The template instance may include a template instance parameter, and the method of automating the application of constraints may further comprise storing in the circuit design file the template instance parameter, wherein the instance parameter is associated on the storage medium with the template instance.

The template instance may include at least one constraint, and the at least one constraint may include a constraint parameter, and the method of automating the application of constraints may further comprise storing in the circuit design file the at least one constraint, wherein the at least one constraint is associated in the circuit design file with the template instance. The circuit design may include a plurality of design objects, the at least one constraint may include a reference to at least one of the design objects, and the method of automating the application of constraints may further comprise storing in the circuit design file the reference, wherein the reference is associated in the circuit design file with the individual constraint.

In general, in a second aspect, the invention features a method of automating the validation of constraints associated with circuit design objects in a circuit design created using an electronic design automation tool. The method of automating validation comprises receiving notification of a change action that affects the design, identifying a template instance validation process associated with the template type, invoking the validation process to validate the constraints, receiving a validity indicator from the validation process, and if the validity indicator indicates that the constraints are not valid, invoking a recovery process.

Embodiments of the invention may include one or more of the following features. The method of automating validation may further comprise retrieving the template instance validation process from a plug-in file associated with the template type. The template instance validation process may be provided by a user of the design automation tool. The method of automating validation may further comprise providing the at least one design object and a template instance parameter to the template instance validation process. The template instance validation process may comprise determining if the value of at least one constraint parameter associated with at least one of the constraints is valid; if the constraint parameter is valid, generating a success indicator; and if the constraint parameter is not valid, generating a failure indicator. The recovery process may comprise deleting the constraints, identifying a template instance generation process associated with the template type, and invoking the template instance generation process to re-create the constraints.

The change action may comprise reading in of a template instance from a storage medium, modification of a template instance parameter, or a combination thereof. The change action may comprise modification of the circuit design. The change action may comprise a change to the at least one constraint, and the recovery process may comprise rejecting the change action. The method of automating the application of constraints may include displaying a template instance representation corresponding to the template instance. The method of automating the application of constraints may further include displaying a template instance tree comprising a template instance node, wherein the template instance node represents the template instance. The method of automating the application of constraints may further include displaying a constraint node as a descendant of the template instance node in the template instance tree, wherein the constraint node represents a constraint associated with the template instance, and displaying a design object node in the tree as a descendant of the constraint node, wherein the design object node represents the design object.

In general, in a third aspect, the invention features a system for automating the application of constraints to design objects in a circuit design created using an electronic design automation tool. The system comprises a design object selector to receive selection of a circuit design object that represents a physical circuit object in a circuit being designed in the electronic design automation tool, a template type selector to receive selection of a template type that produces a constraint that represents a physical limitation upon implementation of the circuit design object in the circuit, wherein the template type is represented in the electronic design automation tool by a selectable user interface feature; and a template instance producer to produce a template instance based upon the template type, wherein the template instance associates the constraint with the circuit design object to represent in the electronic design automation tool that the physical limitation of the constraint applies to the circuit design object.

Embodiments of the invention may include one or more of the following features. The system may comprise a process selector to identify a template instance generation process associated with the template type, a process invoker to invoke the generation process to create the template instance, and an associator to associate the circuit design object with the template instance. The system may comprise a design object writer to store a design object of the circuit design to the circuit design file, and a template instance writer to store a representation of the template instance to the circuit design file, wherein the representation includes an instance name, a template type identifier that specifies the template instance's type, and a design object identifier that specifies the design object.

In general, in a fourth aspect, the invention features a system for retrieving a circuit design annotated with a constraint from a circuit design file on a persistent storage medium. The system comprises a template instance reader to retrieve a representation of a template instance from the circuit design file, wherein the representation includes an instance name, a template type identifier, and at least one design object identifier; a template type selector to identify a template type specified by the template type identifier, a generator plug-in locator to identify a template instance generator associated with the template type if the template type is accessible, and a generator plug-in invoker to invoke the template instance generator to create a restored template instance if the instance generator is accessible, wherein the restored template instance includes a constraint that references at least one design object, wherein the at least one design object is specified by the at least one design object identifier.

In general, in a fifth aspect, the invention features a system for providing a constraint manager user interface in an electronic design automation tool. The system comprises a template instance generator to create a template instance in response to selection of a template type button, wherein the template instance is an instance of a template type associated with the button, a design object selector to receive selection of a design object, a design object mapping component to associate the design object with the template instance, and a template instance display component to display a template instance tree comprising a template instance node, wherein template instance node represents the template instance.

In general, in a sixth aspect, the invention features a computer program product comprising program code for automating the application of constraints to design objects in a circuit design created using an electronic design automation tool. The computer program product comprises program code operable to receive selection of a circuit design object that represents a physical circuit object in a circuit being designed in the electronic design automation tool, program code operable to receive selection of a template type that produces a constraint that represents a physical limitation upon implementation of the circuit design object in the circuit, wherein the template type is represented in the electronic design automation tool by a selectable user interface feature, and program code operable to produce a template instance based upon the template type, wherein the template instance associates the constraint with the circuit design object to represent in the electronic design automation tool that the physical limitation of the constraint applies to the circuit design object.

In general, in a seventh aspect, the invention features a computer program product comprising program code for automating the validation of constraints associated with design objects in a design created using an electronic design automation tool. The computer program product comprises program code operable to receive notification of an change action that affects the design, program code operable to receive identify a template instance validation process associated with the template type, program code operable to receive invoke the validation process to validate the constraints, program code operable to receiving a validity indicator from the validation process, and program code operable to invoke a recovery process if the validity indicator indicates that the constraints are not valid.

DETAILED DESCRIPTION OF THE EMBODIMENTS

The following description is presented to enable any person skilled in the art to make and use the invention, and is provided in the context of particular applications and their requirements. Various modifications to the preferred embodiments will be readily apparent to those skilled in the art, and the generic principles defined herein may be applied to other embodiments and applications without departing from the spirit and scope of the invention. Moreover, in the following description, numerous details are set forth for the purpose of explanation. However, one of ordinary skill in the art will realize that the invention might be practiced without the use of these specific details. In other instances, well-known structures and devices are shown in block diagram form in order not to obscure the description of the invention with unnecessary detail. Thus, the present invention is not intended to be limited to the embodiments shown, but is to be accorded the widest scope consistent with the principles and features disclosed herein.

design object 104, e.g., desired properties of the design object. The constraints 133 may be used by other portions of the EDA tool or by other EDA tools, such as a layout tool or a placement and routing tool (not shown), which may determine a position or orientation of the device based upon the constraints, or in fabrication of a physical device or feature represented by the design object 104, where parameters of the fabrication process may be based upon the constraints 133. A constraint may be, for example, a minimum or maximum distance between two design objects, or an orientation between two design objects. Examples of typical constraint types are shown in the table below.

| Constraint Types | |
| --- | --- |
| Constraint Type | Description |
| Symmetry | Specifies a desired symmetry relation between design objects. |
| Correlation | Specifies a desired correlation between design objects. |
| matchedParameters | Specifies a desired parameter matching between design objects. |
| Orientation | Specifies a desired orientation relationship between design objects. |
| Alignment | Specifies a desired alignment relationship between design objects. |
| layoutStructure | Specifies a desired layout structure for design objects. |
| Cluster | Specifies a desired cluster relationship between design objects. |
| parasiticEstimate | Specifies an estimated parasitic value for design objects. |
| parasiticFilter | Specifies a desired parasitic filter for design objects. |
| areaUtilization | Specifies a desired area utilization for design objects. |
| boundaryArea | Specifies a desired boundary area for design objects. |
| Distance | Specifies a desired distance between design objects. |
| powerStructure | Specifies a desired power structure for design objects. |
| IRDrop | Specifies a desired voltage drop between design objects. |
| relativeOrientation | Specifies a relative orientation between design objects. |

Figure 1A:
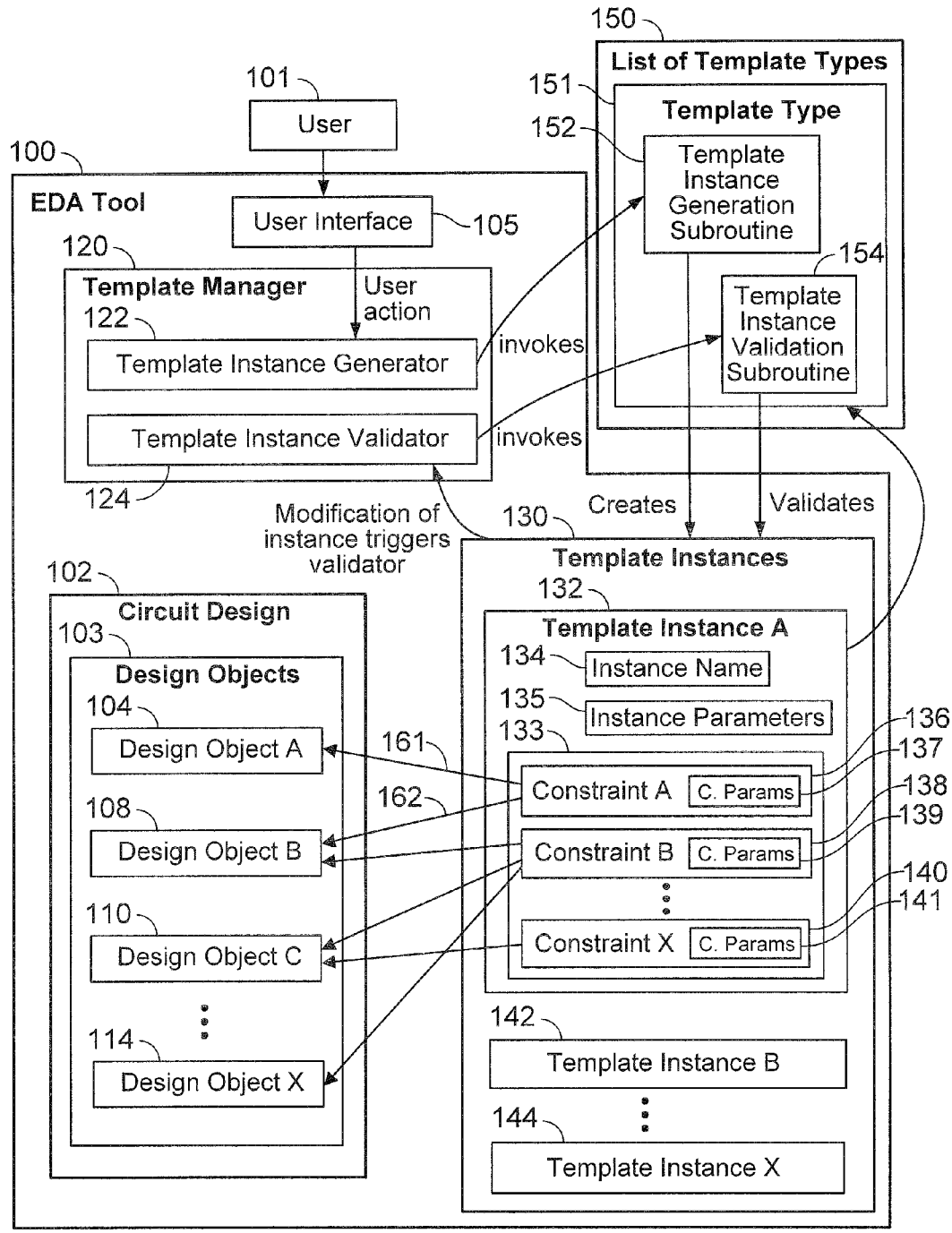
FIG. 1A is an illustrative drawing of a constraint manager and related components in accordance with some embodiments of the invention.

FIG. 1A is an illustrative drawing of a constraint manager and related components in accordance with some embodiments of the invention. An EDA tool 100 allows a user 101 to create a circuit design 102 that represents an electronic circuit. The circuit design 102 is typically a data structure in a computer-readable memory. The user 101 may be, for example, a human user of the EDA tool. The user 101 is typically associated with an organization such as a chip design company. The EDA tool 101 is typically provided by an organization such as an EDA tool vendor. The circuit design 102 includes a set of design objects 103 which represent devices, connections, and other features in the electronic circuit. The design objects 103 include at least one design object, shown as Design Object A 104, also referred to herein as a design object 104. The user 101 interacts with the EDA tool 100 via a user interface 105. The EDA tool 100 may be, for example, the Cadence Virtuoso™ Custom Design Platform from Cadence Design Systems of San Jose, Calif., or another tool for creating circuit designs.

Each design object, such as the design object 104 may be associated with one or more constraints 133, as illustrated by the arrows from the constraints 133 to the design objects 103. The arrows are exemplary and represent one possible set of associations; other associations, i.e., relations or arrows, are possible between the design objects 103 and the constraints 133. The particular set of associations is established by the user 101 for a particular circuit design 102. In general, each of the deign objects 103 may be associated with zero or more of the constraints 133, and each of the constraints 133 may be associated with zero or more of the design objects 103.

The design object 104 may be, for example, a data structure stored in a computer-readable memory. As described above, the constraints 133 represent design intent, i.e., goals, for the A template manager 120 interacts with a set of user-defined template types 150 to manage, i.e., create and verify, using user-defined instructions, sets of constraints associated with the design objects 103. Each set of constraints 133 may, for example, represent one or more design goals or designer-specified parameters for the design objects 103. For example, the constraints 133 may specify that placement of a specified set of design objects in a particular orientation or within a particular distance is desired.

The constraint manager produces a technical effect by assigning constraints to circuit design objects and enforcing the validity of the constraints in an electronic circuit design representation in an Electronic Design Automation tool. The constraints produce a technical effect by, for example, affecting the process of manufacturing a physical semiconductor chip by providing parameter values for steps in the chip layout or fabrication processes. In one aspect, the constraint manager improves the efficiency of the process of assigning constraints to circuit designs by providing features that a circuit designer can use to group constraints. The constraint manager thereby simplifies the task of assigning multiple constraints to a design object.

A template type 151 includes a template instance generation process 152 and a template instance validation process 154 to, respectively, create and verify groups of constraints. Note that the processes described herein may be implemented as a subroutine that includes instructions executable by a computer.

The processes 152,154 and other portions of the constraint template type 151 may be packaged, i.e., stored as a plug-in. A plug-in may be stored in a file, and may include files and associated instructions for registering the processes 152,154 with the template manager 120 so that the template manager 120 can invoke the processes. For example, the processes 152,154 may be registered with the template manager 120 through commands in an application command interface of the EDA tool 100. These commands can be typed interactively by the user 101 or invoked automatically. e.g., by a startup script that is invoked when the EDA tool 100 is initialized. The plug-in may include implementations of the processes 152,154 for each template type in a set of user-defined template types. Template types may also be provided by the EDA tool vendor. Such vendor-provided template types may be used as-is by the user 101, or may be customized or extended by the user to reflect specific aspects of users' circuit design technology.

The constraints 133 are associated with or contained in a template instance 132. The template instance 132 may be represented as, for example, a set of data values or an object instance stored in a computer memory. Each template instance 132 may include a reference to the template type 151 that was used to create the template instance, as shown by the arrow from the template instance 132 to the template type 151. Multiple different template instances may be created for each template type 151, and each template instance 132 may include a corresponding set of constraints 133.

Each template instance 132 includes an instance name 134 which may be, for example, a text string that describes the template instance. Each template instance 132 may also include one or more template instance parameters 135. The template instance parameters 135 allow the user 101 to specify per-template-instance values that may be accessed by the template instance validation process 154. The user may specify the values for the template instance parameters via, for example, the parameter list user interface feature 348 of FIG. 3A.

In one sense, the template instance 132 can be understood as a container that allows the EDA tool, and therefore the user 101, to treat the set of constraints as a single entity with a name and a type. The template instance can be manipulated, e.g., created, modified, and deleted, by user interface actions that apply to the constraints in the template instance, so the user 101 can more easily manage multi-constraint expressions of design intent. Furthermore, because the template instance has an associated type, changes to the set of constraints associated with a particular type of design intent, or changes to creation or validation behavior associated with the type of design intent, can be made in a single place, i.e., the template type, and may be automatically propagated to existing constraints contained in template instances, as well as to constraints in subsequently-created template instances. The template type's validation process 154 ensures that changes made to the constraints do not result in an invalid constraint set 133. The validation process 154 ensures that the constraint set 133 remains valid by re-creating the constraint set 133 if validation fails, and, if the constraint set 133 cannot be re-created in a valid state, by rejecting the changes.

A constraint 136 in the set of constraints 133 may refer to one or more design objects 103 to represent design goals for the design objects 103. The individual constraints in the set of constraints 133 defined by a template type may be related or unrelated to each other, but typically are related to a particular design goal represented by the template type, such as placement of a specified set of design objects in a particular orientation or within a particular distance. Each of the constraints 133 may be associated with one or more constraint parameters 137, which can be name-value pairs which represent the actual design annotations that the constraint 133 applies to the design objects 103.

Each of the constraints 133, e.g., Constraint A 136, may be applied to one or more of the design objects 103 by establishing an association between the constraint 136 and the design objects 103. In one embodiment, each of the constraints 133 includes a reference, i.e., a link, to one or more of the design objects 103 with which the constraint is associated. FIG. 1A shows examples of possible associations between the constraints 133 and the design objects 103. Constraint A 136 is associated with Design Object A 104 and Design Object B 106, as shown by the arrow 161 from Constraint A 136 to Design Object A 104 and the arrow 162 from Constraint A 136 to Design Object B 106, respectively. In one aspect, Constraint A 136 is a constraint that relates the two associated design objects 104,106, such as a distance constraint that specifies a certain distance, specified by constraint parameters 137, to be maintained between the two design objects 104,106.

Similarly, Constraint B 138 is associated with Design Object B 108, Design Object C 110, and Design Object X 114, as shown by the arrows from constraint B 138 to the respective design objects. Constraint B 138 may be, for example, an alignment constraint that specifies how the associated design objects are to be aligned relative to each other, in which case Constraint parameters 139 of Constraint B 138 would specify a type of alignment, e.g., edge, to indicate that the edges of the associated design objects should be aligned.

Constraint X 140 may be, for example, an IR Drop constraint, which specifies a desired voltage drop for the associated Design Object C 110, in which case constraint parameters 141 of Constraint X 140 specify the value of the desired voltage drop.

In FIG. 1, the association between design objects and constraints is represented as arrows from constraints 133 to design objects 103. For example, the arrows 161,162 represent the association of the Design Object A 104 and the Design Object B 108 with the Constraint A 136, as described above. These arrows may be implemented in a computer program as, for example, pointers or object references stored in the constraints 133, where the pointers or object references point to or refer to the design objects 103 associated with the constraints 133.

The association between design objects and constraints may be represented in other ways, e.g., as a list of design objects and associated constraints, or as reference links in the design objects, where the reference links refer to constraints.

The template manager 120 creates the template instances 130, which may include template instance objects that are instances of template types in the list of template types 150. The template instances 130 may be, for example, data structures or objects stored in a computer readable memory. For illustrative purposes, three template instances are shown, including a Template Instance A 132, a Template Instance B 132, and a Template Instance X 144. Each of the template instances 130 is created by and associated with the design object 104 by the template manager 120. For example, in response to a user-initiated command to create a template instance, a template instance generator 122 of the template manager 120 invokes a user-defined template instance generation process 152 to create a template instance 132 and create a set of constraints 133 of the template instance 132. The set of constraints 133 is created by the template instance generation process 152.

The template manager 120 also causes the template instances 130 to be validated when appropriate. For example, in response to modification of at least one of the design object references 161 associated with a constraint 136, or in response to modification of name-value pair parameters associated with the template instance 132 or with the constraint 136, or in response to reading in of a template instance from a file, a template instance validator 124 of the template manager 120 invokes a user-defined template instance validation process 154 to validate the template instance 132.

The template manager 120, including the template instance generator 122, which may be a process, and the template instance validator 124, which may also be a process, may be implemented in a computer program encoded in computer readable media. For example, the template manager 120 may be implemented in a programming language such as Cadence® SKILL, Lisp, C++, Java™ or the like.

The template instances 130 can be created when a user 101 interacts with the user interface 105 by selecting a particular template type 151 to be associated with one or more user-selected design objects 103. The template instance 132 maintains a link, i.e., a reference, to the template type 151 from which the template instance 132 was created. This link provides for updating of the template instance 132 over time as technology changes. For example, if the technology underlying the constraints for a goal associated with the template type 152 changes, then the template instance 132 may be re-created with the new constraints. The template instance validation process 154 may initiate such a re-creation by examining the template instance 132 to determine if the template instance includes appropriate, e.g., up-to-date, constraints 133. The template instance generation process 142 and the template instance validation process 154 may be modified over time to cause re-creation of template instances and constraints to reflect changes in technology. Automatic creation of constraints while maintaining constraints in a correct-by-construction manner is provided by the constraint manager and user-defined template instance generation and validation sub-processes, which the user can define to provide technology-specific constraints and validation behavior. The user can extend the features of the EDA tool with template types that provide those automatic constraint creation and correctness preservation features.

The constraint manager can improve design and manufacturing efficiency by detecting and correcting invalid, i.e., inconsistent, constraints or constraint groups. Invalid constraints may result in fabrication of defective chips, or, if the invalid constraints are detected at a later stage, in wasted effort, because errors detected later in the chip manufacturing process are more difficult to correct than errors detected earlier, such as during the design phase.

When the template instance 132 is associated with a design object, such as the design object 104, the constraints 133 in the template instance are automatically applied to (i.e., associated with) that design object for subsequent use by other portions of the EDA tool 100. Multiple template instances 130 may be created from a single template type 151. The constraints 133 in a template instance 132 are generated by a user-defined instance generation process 152 of the template type 151. The instance generation process 152 may be packaged as a plug-in, and is invoked by a template manager 120 when a user requests creation of a new template instance for that type. The template manager 120 includes a template instance generator 122, which calls the instance generation process 152 to create the template instance 132.

The user 101 may associate template instances 130 with design objects 103 by interacting with the user interface 105. The template instance 132 may include multiple constraints, as illustrated by a Constraint A 136, a Constraint B 138, and a Constraint X 140. Each constraint includes a set of one or more constraint parameters 137, which are, for example, name-value pairs. In one aspect, the name of a constraint parameter 137 represents a required or desired property of the circuit design, and the associated value represents the value of that property.

After the template instance 132 has been associated with one or more of the design objects 103 by the user 101, the integrity, i.e., correctness, of the constraints 133 in the template instance, may be validated in response to certain events. The constraints 133 are validated because the constraints can be modified or deleted by, and such modification or deletion can lead to an incorrect or incomplete set of constraints 133. This validation of the constraints 133 is performed by a user-defined instance validation process 154 associated with the template type. The instance validation process may be packaged as a plug-in, and is called by the template manager in response to certain events. These events include reading a template instance from a storage medium such as a disk file, modification of a template instance parameter, or modification of a constraint. A template instance parameter allows a user 101 to specify a value to be associated with a template instance. These modifications may be performed, for example, by the user. When any of those events occur, a template instance validator 124 of the template manager 120 invokes the instance validation process 154. The instance validation process 154 checks the constraints 133 and any other content of the template instance 132 using conditions defined by the user. If the template instance validation process 154 finds that the template instance 132 is valid, then the template instance validator 124 takes no further action. However, if the template instance is found to be invalid, then the template instance validator 124 may replace the existing constraints 133 with a newly-created set of constraints, or delete the template instance, or reject the change, depending on the type of event.

A process or sub-process is a set of computer program code instructions that can be invoked, i.e., called, by other computer program code instructions, which are referred to herein as invokers. The instructions in a process are executed when the process is invoked. Parameter passing may occur, i.e., input objects may be passed from the invoker to the process when the process is invoked, and output objects may be passed from the process to the invoker when the process returns, i.e. finishes executing or executes a return statement. The process may have process arguments, which are names and types of objects accepted by the process. The arguments receive particular objects provided by the invoker when the process is invoked. The objects provided by the invoker are referred to as parameters. The process may use the parameter objects passed by the invoker to perform computations, and may compute one or more output values, which are returned to the invoker when the process returns.

For example, a user-defined process may be invoked by an EDA tool at a particular point in the EDA tool's execution. Such a user-defined process, which is referred to as a plug-in, allows the EDA tool to be extended with user-defined behavior so that users such as the user 101 can customize the EDA tool for use with their design, layout, and fabrication processes.

In one aspect, the processes 152,154 are associated with each instance of the template type 151. Invoking the template instance generation process 152 twice with the same input, i.e., with the same parameters and design objects, will produce two with the same constraints 133. Invoking the template instance validation process 154 on two template instances of the same template type 151 with the same parameters and design objects will produce the same result, i.e., valid or invalid.

Figure 1B:
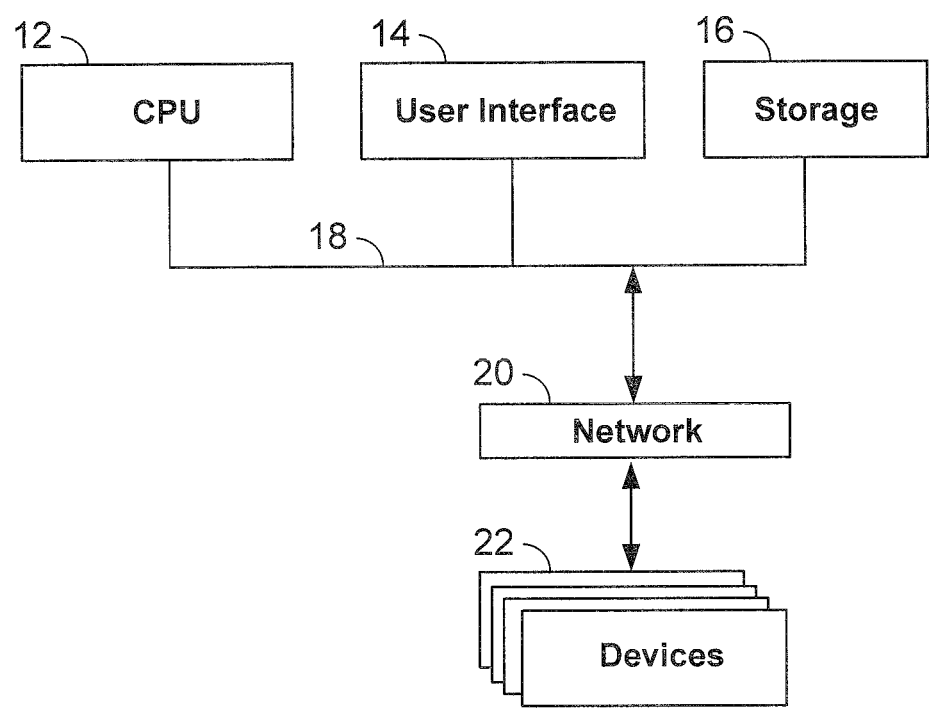
FIG. 1B is a schematic drawing of an illustrative computer system 10 that can run novel processes for generating and validating constraints in accordance with embodiments of the invention.

FIG. 1B is a schematic drawing of an illustrative computer system 10 that can run novel processes for generating and validating constraints in accordance with embodiments of the invention. The computer system 10 includes one or more central processing units (CPU's) 12, a user interface 14, computer readable storage media 16, a system bus 18, and one or more bus interfaces for connecting the CPU, user interface, memory and system bus together. The computer system also includes a network interface 20 for communicating with other devices 22 on a computer network.

Figure 4:
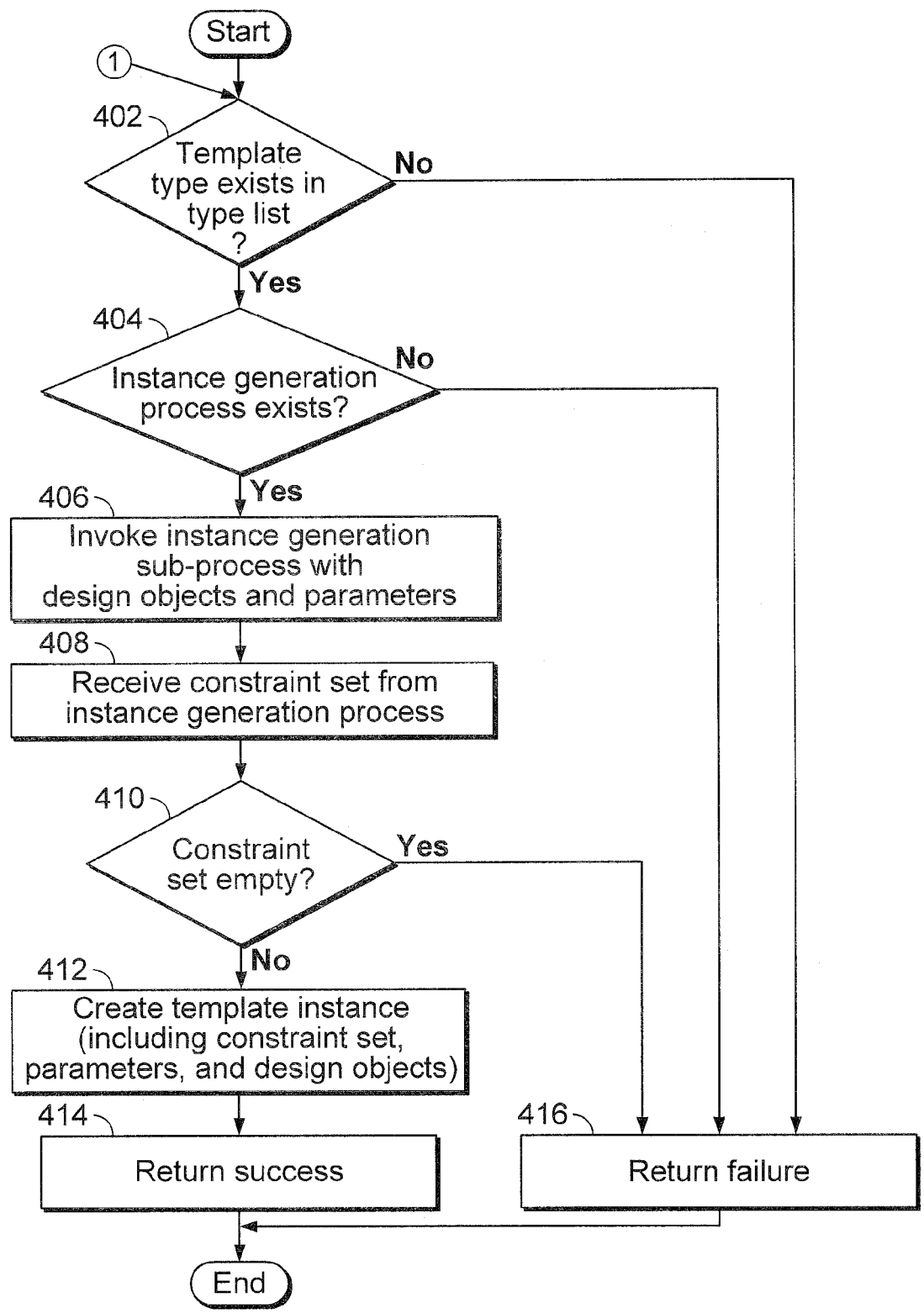
FIG. 4 is an illustrative drawing of a process for generating a template instance in accordance with some embodiments of the invention.
Figure 5:
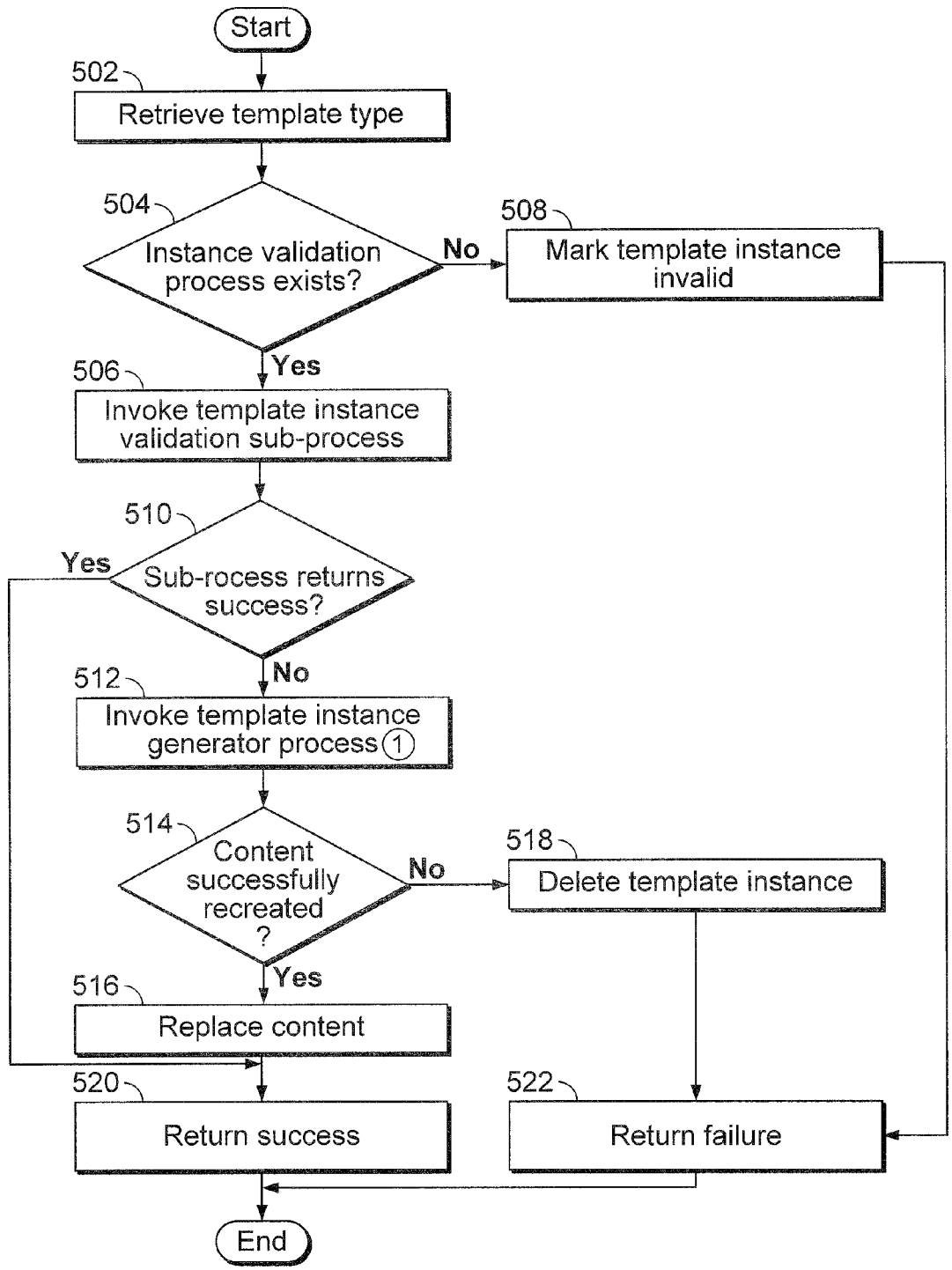
FIG. 5 is an illustrative drawing of a process for validating a template instance in accordance with some embodiments of the invention.
Figure 6:
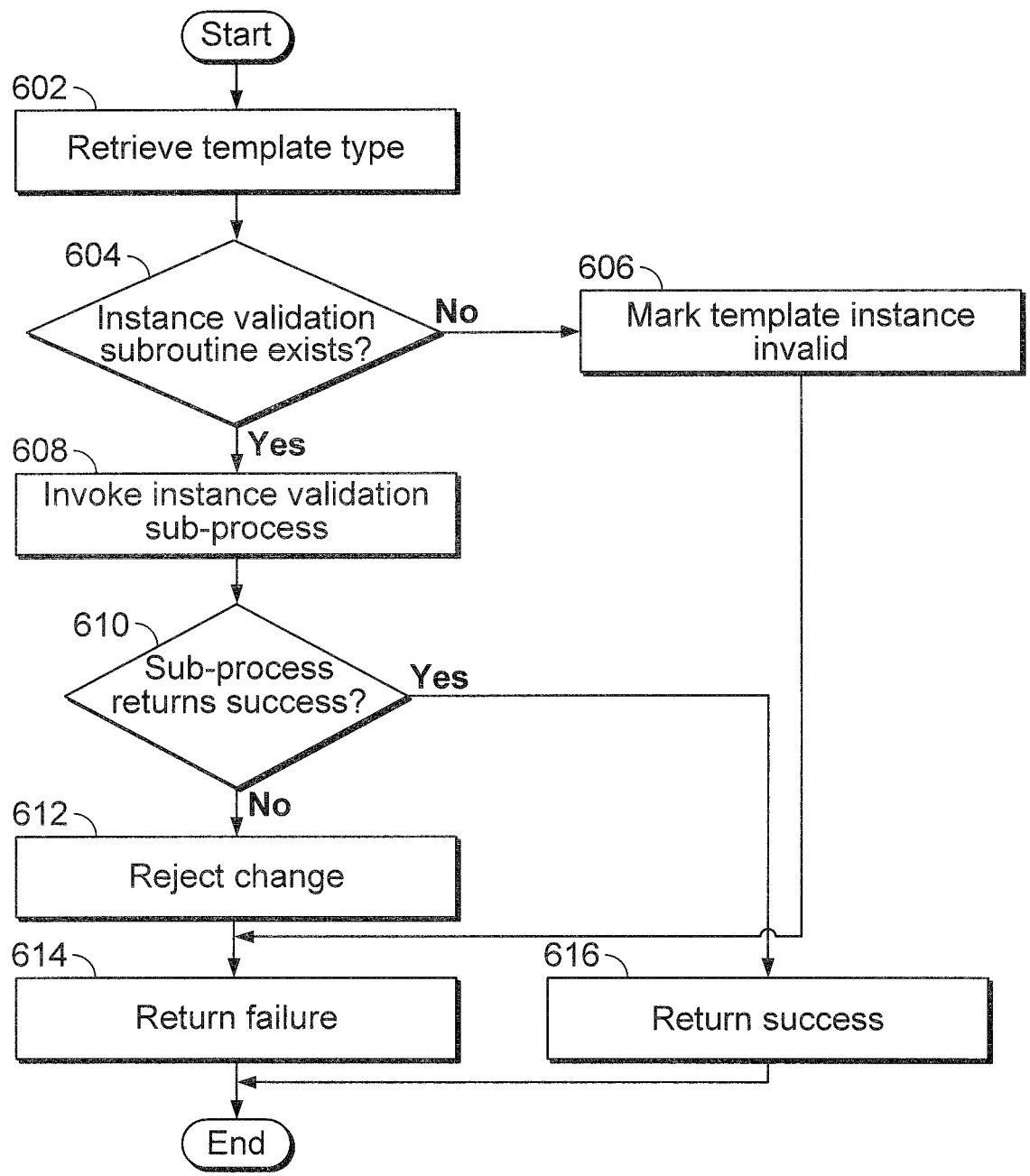
FIG. 6 is an illustrative drawing of a process for validating a template instance in accordance with some embodiments of the invention.
Figure 9:
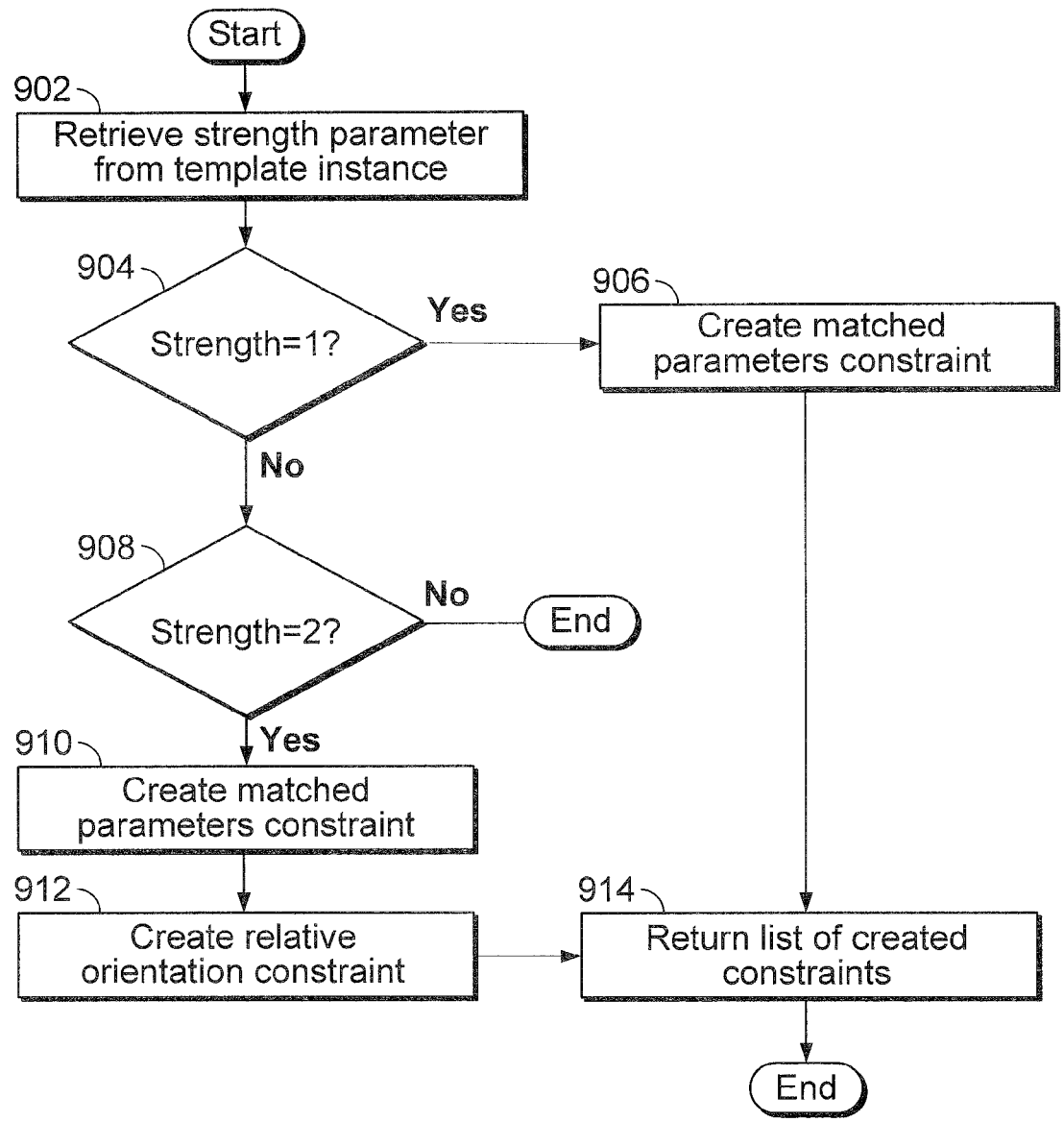
FIG. 9 is an illustrative drawing of a template instance generation sub-process in accordance with some embodiments of the invention.
Figure 10:
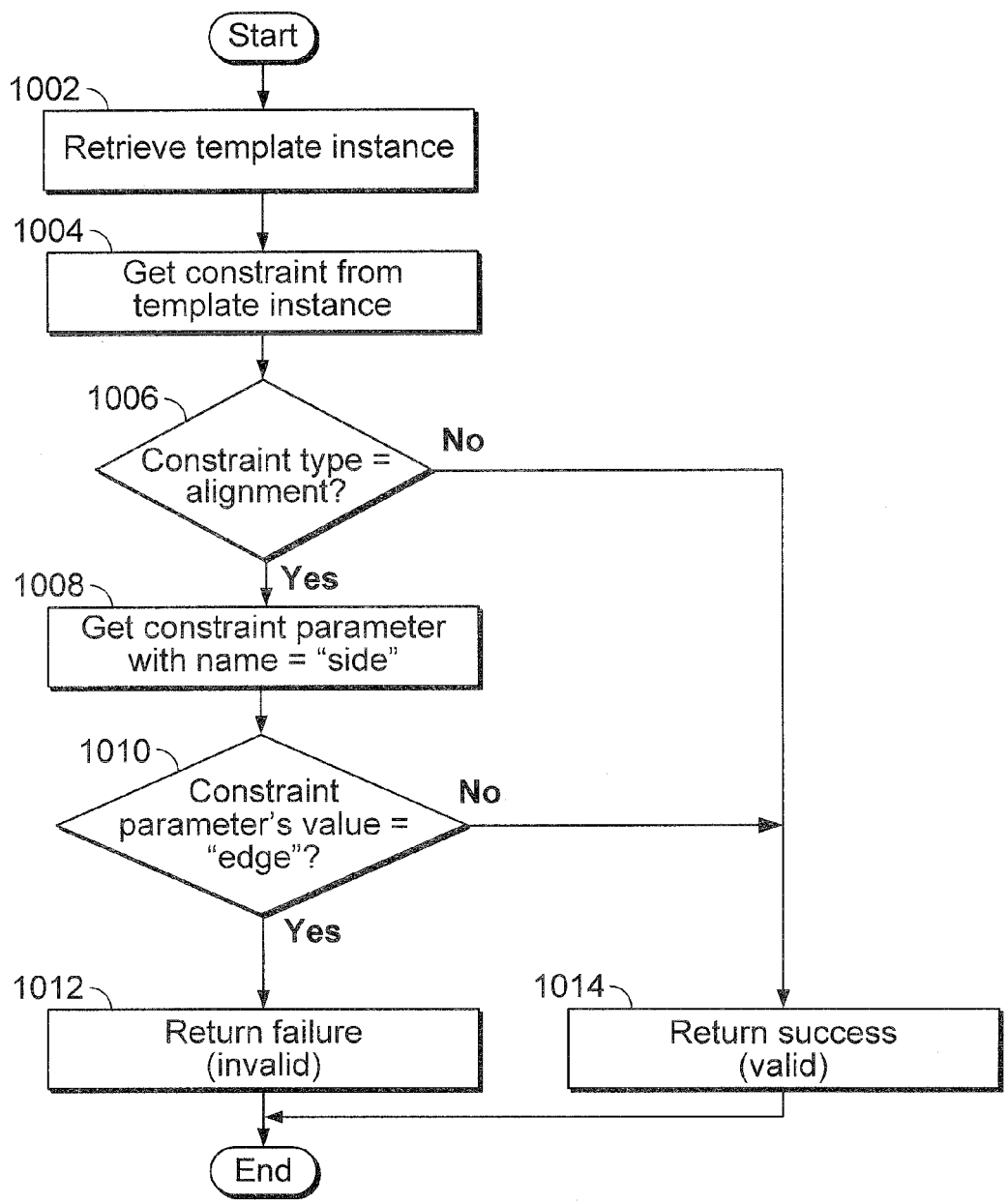
FIG. 10 is an illustrative drawing of a template instance validation sub-process in accordance with some embodiments of the invention.

Computer-readable code such as code for implementing the template instance generation process of FIG. 4, the template instance validation process of FIG. 5 or FIG. 6, the template instance generation sub-process of FIG. 9, or the template instance validation sub-process of FIG. 10 can be stored in the storage memory 16 and used to control the CPU 12. Moreover, a data structure representing constraint template instances such as the template instance data structures 130 can be stored in storage memory 16. The computer program instructions can cause the CPU 12 to produce the template instance data structures 130 and to generate and validate constraint templates that associate constraints with the design objects 103 of the circuit design 102.

Figure 2:
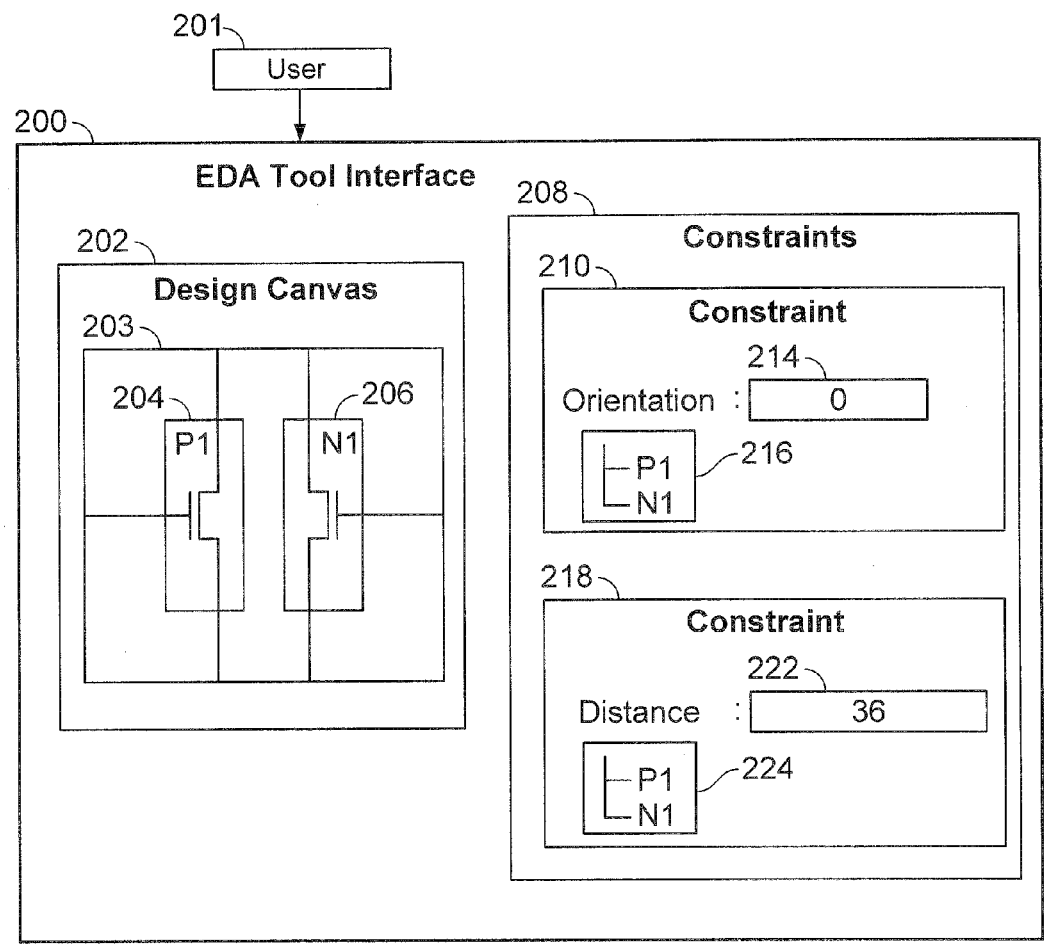
FIG. 2 is an illustrative drawing of prior art constraints in an Electronic Design Automation tool.

FIG. 2 is an illustrative drawing of prior art constraints in an Electronic Design Automation tool. An EDA tool user interface 200 is provided by an EDA tool (not shown). The user interface 200 is displayed on, for example, a workstation computer, and interacts with a user 201, who is typically a circuit designer. The user interface 200 provides a design canvas 202. The design canvas 202 is an area upon which design objects can be placed, positioned, and connected. The user 201 interacts with the user interface 200 to place representations of design objects, such as a transistor representation P1 204 and a transistor representation N2 206, on the design canvas 202 to create a circuit diagram 203, which is a displayed representation of a circuit design corresponding to the circuit design 102 of FIG. 1A.

The EDA tool typically stores the circuit diagram 203, including the design objects on the design canvas 202, on a storage medium such as a disk file. The EDA tool can subsequently read in the circuit diagram 203 from the file, so that the circuit diagram can persist after the EDA tool program has stopped running, or after the workstation has lost power. The file also allows the circuit diagram 203 to be shared among different users in different locations. The file may be stored on a storage medium such as a magnetic disk or tape. Users' intellectual property is typically encoded in constraint management and validation sub-processes. Such intellectual property is protected from unauthorized distribution because users need not make their template types or sub-processes public. In one aspect, users can control the distribution of circuit designs that use their constraint types because the template instances, i.e., constraints, associated with circuit designs can only be loaded by the EDA tool if the template types and sub-processes are available. That is, loading of a template instance is prevented if the template instance's corresponding template type definition is not available to the EDA tool.

The user 201 may add design objects such as the transistor P1 204 to the circuit design 203, e.g., by selecting a transistor device from a palette of device types (not shown) and placing the transistor device at an appropriate position on the canvas 202. The user 201 may connect the design objects using connectors, which are another type of design object. The user may associate constraints with the design objects of the circuit design 203 by, for example, selecting a design object from the palette, selecting a menu option to add a constraint, and entering the name and value of the constraint. In this example, a constraint browser 208 shows two constraints, an orientation constraint 210 and a distance constraint 218. The orientation constraint 210 indicates, e.g., to a circuit designer or to another component of the EDA tool, that associated design objects 216 should be oriented in a certain way, as specified by parameters 214. The orientation constraint 210 is associated with the transistor P1 204 and the transistor N1 206, as shown by the associated design objects 216. The distance constraint 218 is similarly associated with the transistor P1 204 and the transistor N1 206, as shown by associated design objects 224. The distance constraint 218 indicates that the associated design objects 224 should be separated by a distance specified by a distance parameter 222.

Figure 3A:
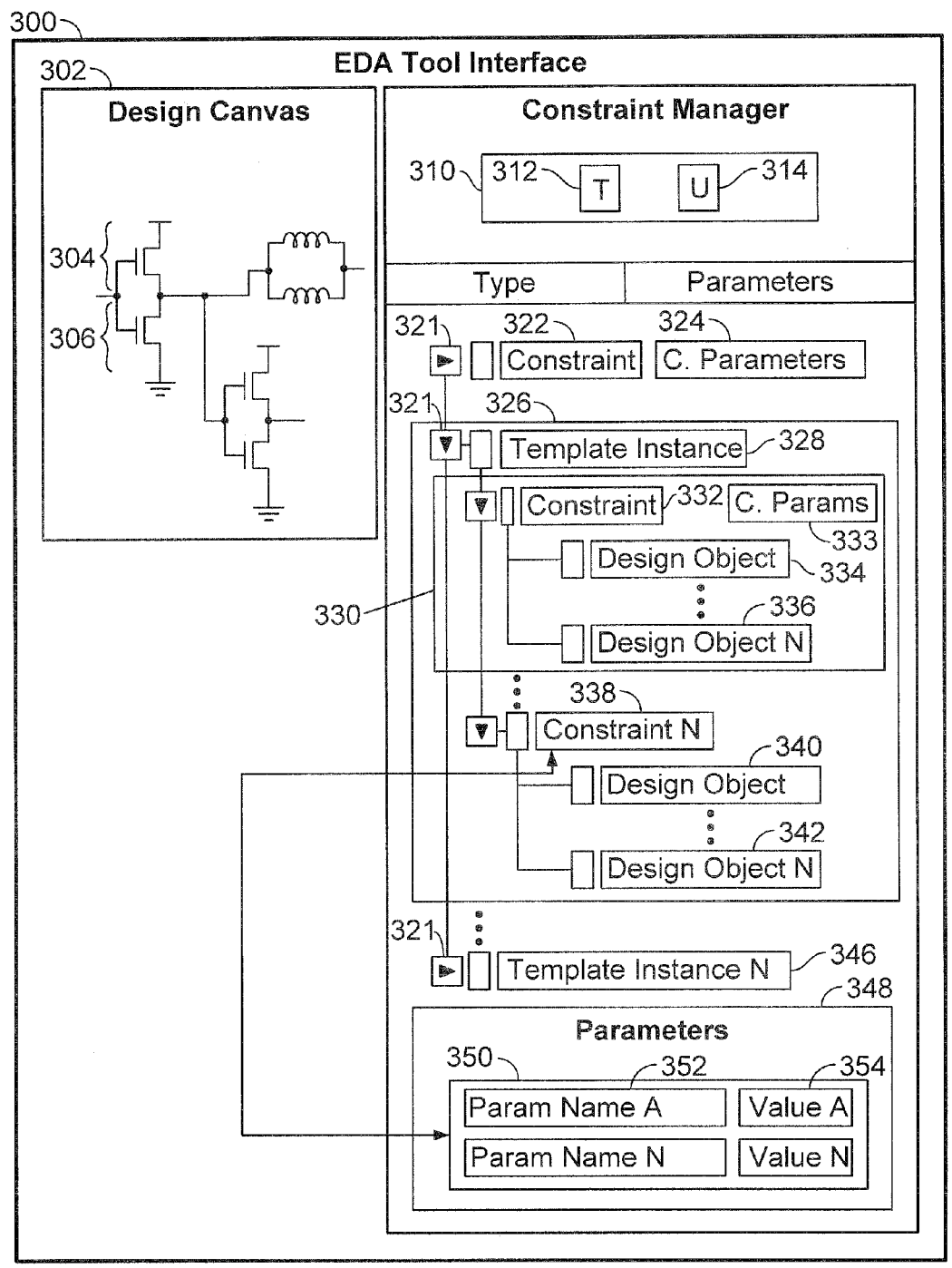
FIG. 3A is an illustrative drawing of a constraint manager user interface in an Electronic Design Automation tool in accordance with some embodiments of the invention.

FIG. 3A is an illustrative drawing of a constraint manager user interface in an Electronic Design Automation (EDA) tool in accordance with some embodiments of the invention. An EDA tool user interface 300 includes a design canvas component 302 similar to the design canvas 202 described above. The EDA tool user interface is an example of the user interface 105 of FIG. 1A. The EDA tool user interface 300 also includes a constraint manager component 303, which is a user interface that displays a set of template types 310 and allows a user to create a template instance 326.

A user may associate constraints with design objects by creating a template instance. To create a template instance, the user identifies the design objects that are to be constrained, e.g., by selecting one or more design objects, such as the transistors 304,306, from the design canvas 302. Next, the user selects a template type from a set of template types 310 to create the desired constraints. The set of template types 310 is shown as a set of icons, which are user interface features that have a distinct visual appearance. Two example template type icons, icon T 312 and icon U 314, are shown. The template types 312,314 are displayed as icons that include illustrations of, for example, a single-letter abbreviation that identifies the template type. Alternatively, the template types could be displayed as a menu of type names, e.g., a drop-down or pop-up menu. The name or icon 312 of the template type typically indicates the goal associated with the template type, to allow the user to decide, based on the appearance of the name or icon, which template type to select to create a desired set of constraints.

Next, the user may provide values for template instance parameters. The names and types of template instance parameters are provided by the template type and may be displayed as data fields for which the user can provide values. A template instance is then created by the template manager 120 of FIG. 1A. The template instance includes the constraints from and stores references, i.e., links, to the design objects and the template instance parameters. For example, the design object 334 may represent the transistor 304, and the design object N 336 may represent the transistor 306.

The constraint manager 303 displays previously-created independent constraints, such as an independent constraint 322, and previously-created template instances, such as the template instance 326 and a template instance N 346. The independent constraint 322 is a constraint that is not associated with a template instance and is ordinarily created directly, i.e., without use of a template instance, in response to a user command. The independent constraint 322 may be associated with independent constraint parameters 324. When a new independent constraint or template instance is created, a visual representation of the constraint or template instance is displayed by the constraint manager 303 with the existing constraints and template instances, e.g., below those existing objects in a scrollable list.

Each displayed template instance may be shown in an expanded state or in a collapsed state. The template instance 326 is shown in the expanded state, in which a template instance name 328, constraints 332, design objects 334,336, and constraint parameters 333 are displayed. The template instance N 346 is shown in the collapsed state, in which only the template instance name is shown. The user can toggle between the expanded and collapsed states by selecting a tree expansion user interface feature 321, which is displayed, for example, as a box enclosing an arrow adjacent to the object, e.g., template instance or constraint, which can be expanded or collapsed.

The template instance 326 is shown in the expanded state, with an associated constraint 330 and an associated constraint N 338. The constraint 330 is also shown in the expanded state, in which constraint parameters 333, a design object 334, and a design object N 336 are shown. The constraint parameters 333 have initial values, which are provided by the template type 312. The values of the constraint parameters 333 may be changed by the user.

The user may provide template instance parameter values in the parameter list user interface feature 348, which may be, for example, a two-column list 350, in which the first column displays a parameter name 352, and the second column displays a parameter value 354. The user may edit the parameter value 354 to change the value of a parameter. The parameter list feature 348 displays the predefined template type parameters. The user may select parameter values for the template instance using a drop down menu or similar user interface feature (not shown). In one example, the template instance 326 displays template instance parameters but not constraint parameters. In another example, the same parameters, e.g., both the template instance parameters and the constraint parameters, may be displayed as part of both the template instance 326 and the parameter list feature 348. The template instance 326 appears in the EDA tool user interface 300 as a displayed representation of the template instance.

Figure 3B:
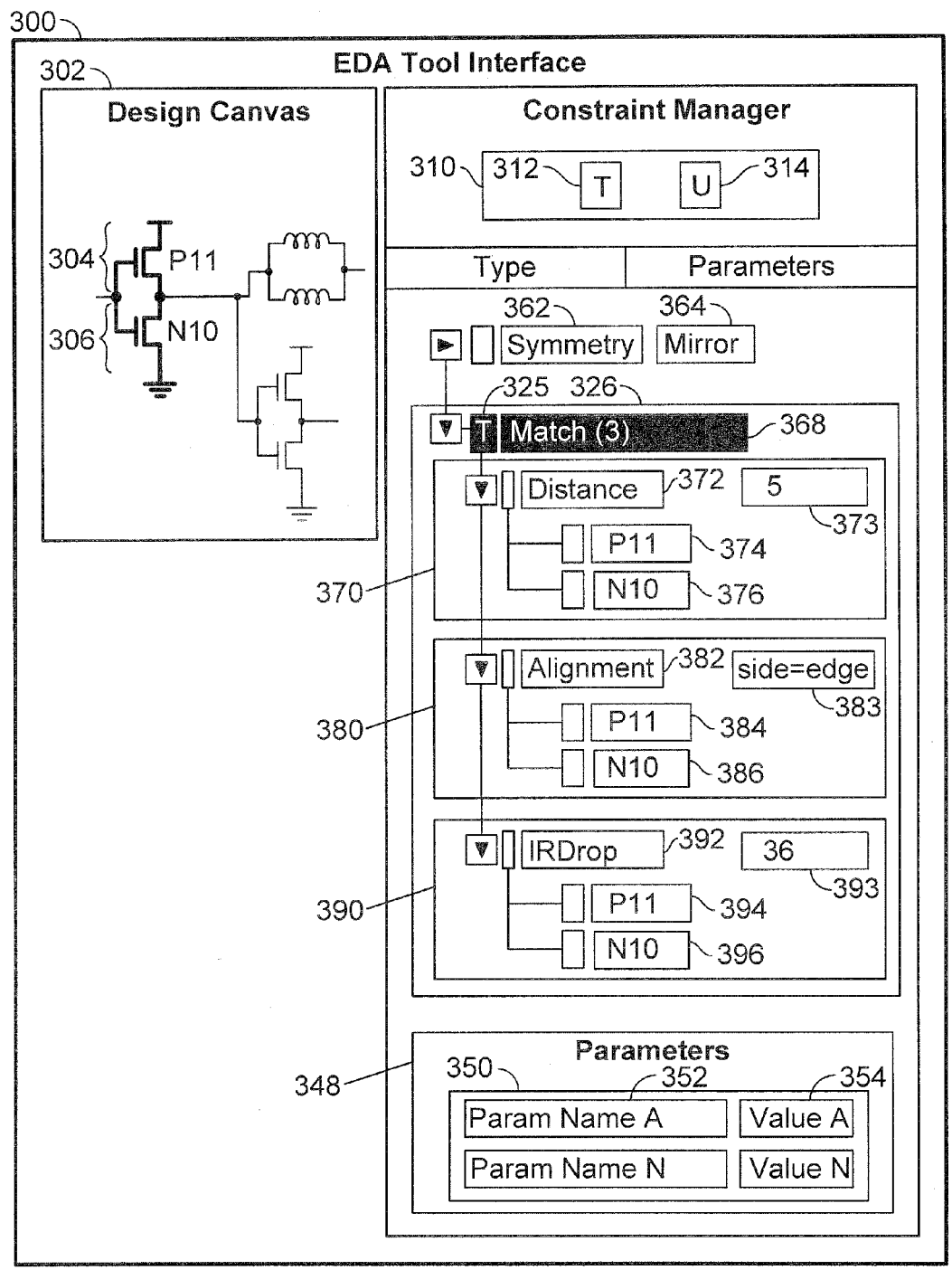
FIG. 3B is an illustrative drawing of a constraint manager user interface displaying specific constraints in an Electronic Design Automation tool in accordance with some embodiments of the invention.

FIG. 3B is an illustrative drawing of a constraint manager user interface displaying specific constraints in an Electronic Design Automation tool in accordance with some embodiments of the invention. Specific constraints are shown in the EDA tool user interface 300, including an independent Symmetry constraint 362 with an associated constraint parameter 364 that has the value "Mirror". A template instance 326 is named "Match", as shown by the name 368. The Match template instance 326 includes a Distance constraint 370, an Alignment constraint 380, and an IR Drop constraint 390. The Distance constraint 370 has a constraint parameter 373 with the value 5, which indicates that the desired distance between the associated design objects P11 374 and N10 376 is 5 distance units. The Alignment constraint 380 has a constraint parameter 383 with the value side=edge, which indicates that the alignment of the associated design objects is to be determined by the edges of the objects. The IR Drop constraint 390 has a constraint parameter 393 with the value 36, which indicates that the voltage drop between the associated design objects is 36 voltage units. A "T" icon 325 displayed adjacent to a name 368 of the Match template instance 326 indicates that the Match template instance 326 is an instance of the template type T 312. The highlighted display state of the name 368 indicates that the Match template instance 326 is a selected template instance, i.e., has been placed in a selected state by the user. The design objects associated with the selected template instance are highlighted in the design canvas 302. For example, since the design objects P11 304 and N10 306 are associated with the Match template instance 326, and the Match template instance is selected, the design objects P11 304 and N10 306 are highlighted using thicker lines than other design objects on the canvas 302.

FIG. 4 is an illustrative drawing of a process for generating a template instance in accordance with some embodiments of the invention. The process of FIG. 4 corresponds to the template instance generator 122 and is invoked by the template manager 120 of FIG. 1A when a new template instance is to be created, e.g., when a user selects a template type icon such as the T icon 312 in the user interface 300 of FIG. 3A. The process creates a template instance for a given template type, a given set of design objects, and a given set of template instance parameters. The process begins at block 402 by determining if the given template type exists in a list of template types. If the template type does not exist, then the process ends by returning a failure status at block 416. If the template type does exist, then block 404 determines if there is an instance generation sub-process associated with the template type. If there is no such sub-process, then the process ends by returning a failure status at block 416. If there is an instance generation sub-process, then block 406 invokes, i.e., calls, the instance generation sub-process with the design objects and template instance parameters as input parameters for the sub-process. The instance generation sub-process may create a constraint set, or may return an empty set. Block 410 determines if the instance generation process created an empty constraint set, and if so, the process ends by returning failure at block 416. If the constraint set is not empty, block 412 creates a template instance, e.g., an object in a computer programming language, and associates the constraint set, the parameters, and the design objects with the template instance, e.g., by setting corresponding data members of the object to reference the constraint set, the parameters, and the design objects. The process then ends by returning success at block 414.

FIG. 5 is an illustrative drawing of a process for validating a template instance in accordance with some embodiments of the invention. In one aspect, the validation process is invoked in response to events that could cause the template instance to become invalid. These events include changes to parameters and reading in of the template instance from a file. The validation process of FIG. 5 corresponds to a portion of the template instance validator 124 and is invoked by the template manager 120 of FIG. 1A if constraint parameters or template parameters change, because changes to the parameters can cause the template instance to become invalid. The validation process of FIG. 5 is also invoked if a template instance is read in from a file, because changes to the template instance made outside of the EDA tool can cause the template instance to become invalid. The file may be stored on persistent storage media such as a magnetic disk drive, an optical drive, random access memory, or flash memory. In other examples, the validation process may be invoked in response to other events such as changes to the circuit design, e.g., when a design object is added, deleted, or modified The validation process of FIG. 5 invokes a template instance validation sub-process to validate a given template instance. The validation process begins at block 502 by determining if a template type for the given template instance exists in a list of template types. If the template type does not exist, then block 508 marks the template instance invalid to prevent further use of the template instance, and the process ends by returning a failure status at block 522. If the template type exists, then block 506 invokes the instance validation sub-process associated with the template type. Block 506 passes the constraints and template instance parameters associated with the template instance to the instance validation sub-process. The instance validation sub-process is typically provided by a user, and ordinarily determines if the instance, including the constraints, is valid according to user-defined criteria. Next, block 510 determines if the instance validation sub-process returned a successful status. If the sub-process returned a successful status, then the validation process exits with a successful status at block 520. Block 512 performs a recovery process. If the sub-process returned a failure status, then block 512 invokes the template instance generation process of FIG. 4, starting at block 402, to re-create the template instance from the template type. The instance generation process then attempts to recreate a template instance, including content, e.g., constraints, and if a template instance is successfully recreated, returns a success status. Block 514 checks the return value of the instance generation process to determine if the content was successfully recreated. If the content was not successfully recreated, then block 518 deletes the template instance to prevent subsequent use of the template instance, and the process exits with a failure return status at block 522. If the content was successfully created, then block 516 replaces the existing content (e.g., constraints) of the template instance with the newly created content, and the process exits with a successful return status at block 520.

FIG. 6 is an illustrative drawing of a process for validating a template instance in response to constraint changes in accordance with some embodiments of the invention. The validation process of FIG. 6 corresponds to a portion of the template instance validator 124 and is called by the template manager 120 of FIG. 1A if there is a change in the set of constraints associated with a template instance, or if there is a change to a constraint parameter, or if there is a change in the set of design objects (i.e., a design object reference) associated with a constraint of a template instance. A template instance for which a constraint has changed is passed to the process of FIG. 6. The process begins at block 602 by retrieving the template type that corresponds to the template instance by, for example, retrieving a reference to the template type from the template instance. Block 604 determines if there is an instance validation sub-process associated with the template type. If no such instance validation sub-process exists, then block 606 marks the template instance as invalid to prevent it from being used subsequently, and the process ends by returning a failure status at block 614. If an instance validation sub-process exists, then block 608 invokes the instance validation sub-process by, for example, making a procedure call. Block 608 passes the constraints and template instance parameters associated with the template instance to the instance validation sub-process. The instance validation sub-process then executes, and returns a success value to indicate whether the instance is valid. Next, block 610 determines if the instance validation sub-process returned success. If the instance validation sub-process returned success, then the validation process exits with a success value at block 614. If the instance validator sub-process did not return success, then block 612 rejects the change to the constraints by, for example, restoring the previous value of the constraints, and the validation process ends at block 614 by returning a failure status.

Figure 7:
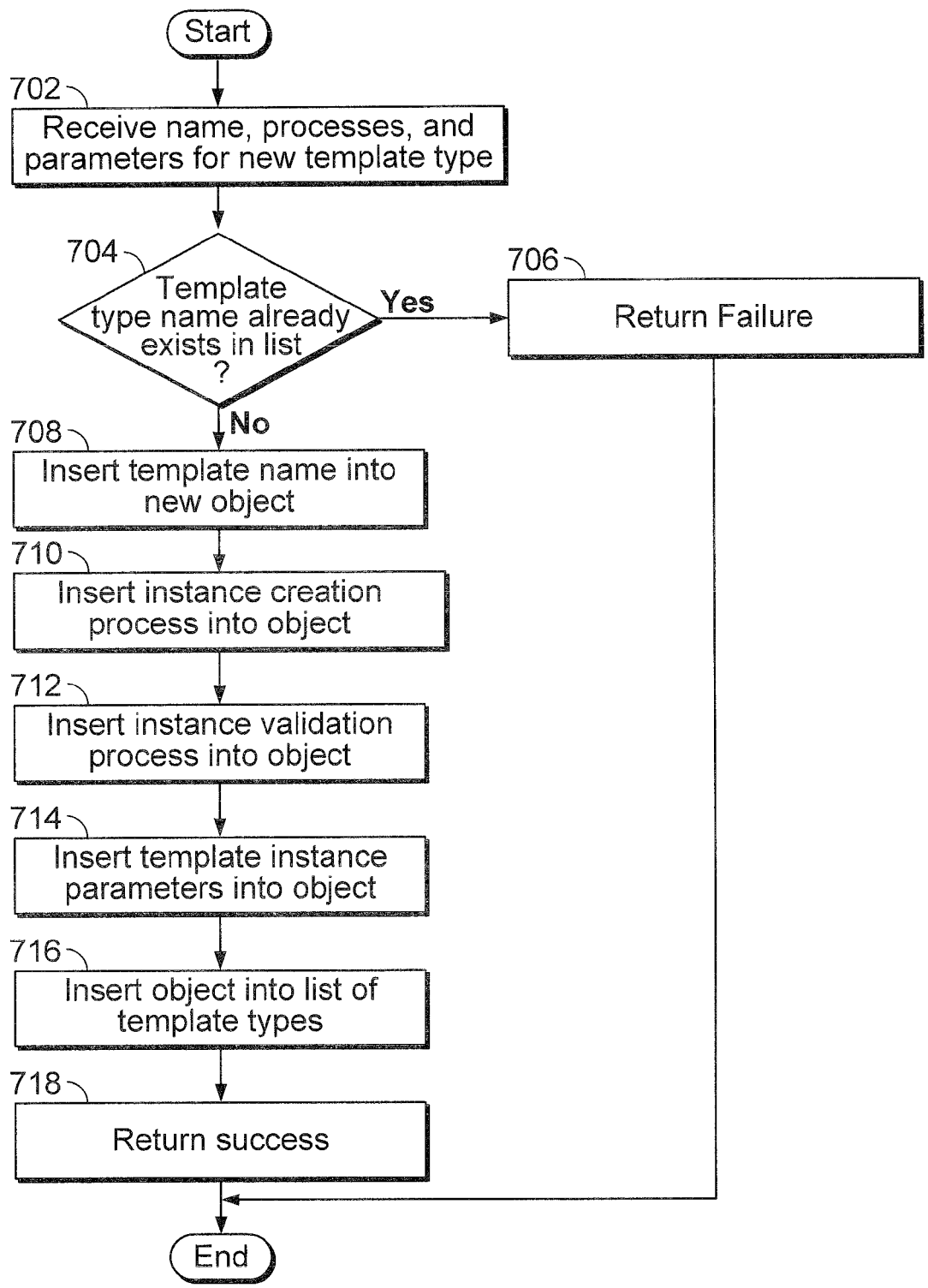
FIG. 7 is an illustrative drawing of a process for defining a template type in accordance with some embodiments of the invention.

FIG. 7 is an illustrative drawing of a process for defining a template type in accordance with some embodiments of the invention. The process of defining a template type is typically performed by a user who interacts with a template type definition interface of the EDA tool to define the template type. The template type definition interface may be a graphical user interface, or a text-oriented command based interface, or a combination of the two.

The process of defining a template type begins at block 702 by receiving a template name, template instance creation and validation processes, and template instance parameters for the new template type. Block 704 determines if a template type with the template name already exists by, for example, searching a list of template types for the template name. If a template type with the template name exists, then the process ends at block 706 by returning failure. Otherwise, block 708 creates a new object, e.g., an object in a programming language such as Cadence® SKILL, Lisp, C++, Java™ or the like, to represent the template instance, and inserts the template name into the template type object. Blocks 710 and 712 then insert references to the instance creation and validation processes, respectively, into the template type object. As described above with respect to FIG. 1A, the template instance creation and validation processes may be registered with the template manager 120 of FIG. 1A through commands in an application command interface of the EDA tool using existing features of the EDA tool. Block 714 inserts the template instance parameter definitions into the template instance type, and block 716 registers the template type object with the template manager by, for example, inserting the object into the list of template types. Block 718 returns success to indicate that the template type was successfully created. In one example, only parameters that match the parameter definitions created in block 714 may be used as parameters for the template instance when the template instance is created. In that example, only parameters that match the parameter definitions will be accepted as valid template instance parameters for a template instance by the parameter list user interface feature 348 of FIG. 3A.

Figure 8:
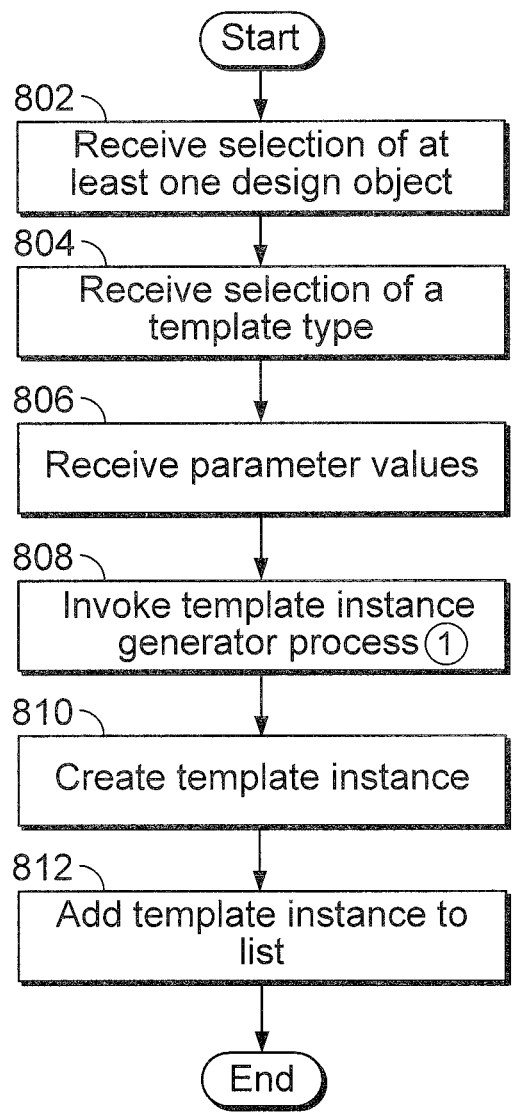
FIG. 8 is an illustrative drawing of a process for creating a template instance in an Electronic Design Automation tool user interface in accordance with some embodiments of the invention.

FIG. 8 is an illustrative drawing of a process for creating a template instance in an Electronic Design Automation tool user interface in accordance with some embodiments of the invention. This process is typically executed by the EDA tool when the tool's user interface receives a request from a user to create a template instance The process begins at block 802 by identifying, i.e., receiving selection of, a set of one or more design objects to be constrained. Block 804 identifies or receives a template type to be used to constrain the objects. Block 806 identifies or receives a parameter set for the template instance, and block 808 invokes a template instance generation process, such as the process of FIG. 4, to create a constraint set based on the design objects, the template type, and the parameter set. Block 810 creates the template instance as, for example, an object in a computer programming language. The template instance includes the constraints created in block 808, a reference to the design objects and the parameters prepared in block 806. Block 812 ads the template instance to a list of template instances.

FIG. 9 is an illustrative drawing of a template instance generation sub-process in accordance with some embodiments of the invention. The template instance generation sub-process is typically a user-defined process, and is ordinarily invoked by the template instance generation process of FIG. 4. The instance generation sub-process shown in FIG. 9 is an example of a user-defined sub-process and is specific to particular types of user-defined constraints, including a Matched Parameters constraint and a Relative Orientation constraint, which are related to semiconductor technology. The instance generation sub-process receives a strength parameter, which is a user-defined parameter that is meaningful to the user and is passed from the user to the instance generation sub-process when a template instance is created. In one aspect. the template instance parameters, such as the strength parameter, are treated by the template manager as opaque, uninterpreted values, The MatchedParameters and Relative Orientation constraints, and the strength parameter, are described as part of the example instance generation sub-process, and are necessarily present in other examples of the instance generation sub-process.

The instance generation sub-process begins at block 902 by retrieving a strength parameter value from the template instance for which the sub-process was invoked. The template instance may be retrieved from an input parameter of the sub-process. Block 904 determines if the strength parameter is equal to 1. If the strength parameter is 1, then block 906 creates a Matched Parameters constraint, sets the parameters of the template instance to appropriate values, block 914 returns to the invoker a list that contains the Matched Parameters constraint, and the process ends. The template instance parameters may determine the constraint list and the constraint parameters, as determined by the template instance generation sub-process invoked by block 406 of FIG. 4.

If the strength parameter is 2, block 910 creates a Matched Parameters constraint and with appropriate parameters, block 912 creates a Relative Orientation constraint with appropriate parameters, and block 914 returns to the invoker a list that contains the Matched Parameters and Relative Orientation constraints. If block 908 determines that the strength parameter is not equal to 2, then no action is taken and the sub-process ends, although different implementations of the sub-process could generate different constraints for subsequent strength values.

FIG. 10 is an illustrative drawing of a template instance validation sub-process in accordance with some embodiments of the invention. The template instance validation sub-process is typically a user-defined process, and is ordinarily invoked by the template instance validation processes of FIGS. 5 and 6 to determine if a template instance is valid, and, in one aspect, if the constraint set of the template instance valid. In this example, the constraint set is considered to be invalid if the first constraint in the set is an "alignment" type constraint, and a parameter of the first constraint has the name "side" and the value "edge". Any other constraint set is considered to be valid in this example.

The instance validation sub-process begins at block 1002 by retrieving the template instance for which the sub-process was invoked, e.g., by retrieving the template instance from an input parameter of the sub-process. Block 1004 retrieves the first constraint from the template instance. Block 1006 determines if the constraint type is equal to "alignment". If the constraint type is not equal to "alignment", then the constraint set is considered to be valid, block 1014 returns a success value to the invoking process to indicate that the template instance is valid, and the sub-process ends. If the constraint type is equal to "alignment", then block 1008 attempts to get a constraint parameter with the name "side". Block 1010 determines if the alignment constraint contains a parameter with the name "side" and the value "edge". If such a constraint is present, then the sub-process returns failure to indicate to the invoking process that the constraint set is invalid. If no such constraint is present, then the sub-process returns success to indicate that the constraint set is valid.

The template instance validation sub-process may also receive a change action parameter, which indicates the type of change action, e.g., modification of a parameter, deletion of a constraint, modification of a constraint parameter, or reading in of a template instance from storage. Other change action types may be added as well, e.g., an action type that indicates the design object has changed. The user-defined validation process may use that action parameter when validating the constraints.

For example, a template instance generation process could create a template instance with three constraints, named Matched Parameters, Alignment, and Relative Orientation, as follows:

(Template-Instance name=match parameters=(param=value)
(constraint name="Matched Parameters" parameters=("l, w, m") design-objects=(P11 N10))
(constraint name="Alignment" parameters=(side="right" "top/left" design-objects=(P11 N10))
(constraint name="Relative Orientation" parameters=("R0") design-objects=(P11 N10)))

The validation sub-process shown in FIG. 10 would reject any change to the Alignment constraint that would set the value of the "side" parameter to "edge".

A constraint may be changed are when (1) the template instance is read in from a file, (2) a template instance parameter in edited the EDA tool UI, or (3) a constraint is edited in the user interface, i.e., a constraint parameter or design object reference is changed in the UI. In one aspect, changes to the design objects themselves do not trigger the constraint observer.

In case (1) if a change to the template instance results in the "side" parameter being set to "edge" when the template instance is read in from storage, then the template generation process shown in FIG. 4 will be invoked to re-create the template instance's content, thereby returning the template instance to the state shown above. Any other changes would be accepted without re-creating the constraints.

In case (2), changes to the template instance parameters do not affect the constraint parameters, so the "side" constraint parameter cannot be made invalid s a result of a template instance parameter change.

In case (3), if a change to a constraint or design object reference results in the "side" parameter being set to "edge", then, according to the flowchart shown in FIG. 6, the change would be rejected, i.e., not applied to the constraint. Furthermore, each change to a constraint or design object reference is individually verified and rejected or accepted. Any other changes would be accepted.

The ability to trigger the constraint validation sub-processes upon read-in of a template instance provides for the automatic repair and re-creation of constraints. Since the instance validation and generation sub-processes may be user-defined, the user can provide instructions for repairing and re-creating the constraints in accordance with the user's technology or fabrication processes.

The above description is exemplary only and it will be apparent to those of ordinary skill in the art that numerous modifications and variations are possible. For example, various exemplary methods and systems described herein may be used alone or in combination with various other computer and computer peripheral systems and methods. Additionally, particular examples have been discussed and how these examples are thought to address certain disadvantages in related art. This discussion is not meant, however, to restrict the various examples to methods and/or systems that actually address or solve the disadvantages.

What is claimed is:

1. A method of automating the validation of constraints associated with circuit design objects in a circuit design created using an electronic design automation tool, comprising:

using a computer for providing a template type in a computer system;

wherein the template type includes a selectable template type identifier in produced in a computer user interface display of the computer system to identify the template type;

wherein template type includes template instance generation code stored in non-transitory computer readable storage media of the computer system to run a template instance generation process;

wherein the template type includes template instance validation code stored in non-transitory computer readable storage media to run a template instance validation process;

receiving by the computer system, a user selection of the template type identifier;

in response to the received user selection of the template type identifier, invoking the template instance generation code to run the template instance generation process on the computer system, to produce a template instance;

wherein the produced template instance identifies a constraint set that includes multiple constraints and that identifies associations between the multiple constraints in the constraint set and the one or more design objects to store the produced template instance in the memory device and to create an association in the memory device between the produced template instance and the template type;

in response to receiving notification of an event that could cause the template instance to become invalid, invoking the validation process to validate the constraints associated with the template instance;

receiving a success indicator from the validation process; and if the success indicator indicates that the constraints are not valid, invoking a recovery process.

2. The method of claim 1, further comprising:
retrieving the template instance validation process from a plug-in file associated with the template type.

3. The method of claim 1, wherein the template instance validation process is provided by a user of the design automation tool.

4. The method of claim 1, further comprising providing the at least one design object and a template instance parameter to the template instance validation process.

5. The method of claim 4, wherein the template instance validation process comprises:
determining if the value of at least one constraint parameter associated with at least one of the constraints is valid;
if the constraint parameter is valid, generating a success indicator; and
if the constraint parameter is not valid, generating a failure indicator.

6. The method of claim 1, wherein the recovery process comprises:
deleting the constraints;
identifying a template instance generation process associated with the template type; and
invoking the template instance generation process to re-create the constraints.

7. The method of claim 1. wherein the event comprises reading in of a template instance from a storage medium, modification of a template instance parameter, or a combination thereof.

8. The method of claim 1, wherein the event comprises modification of the circuit design.

9. The method of claim 1, wherein the event comprises a change to the at least one constraint, and the recovery process comprises:
rejecting the change action.

10. A non-transitory computer readable storage media comprising program code for automating the validation of constraints associated with design objects in a design created using an electronic design automation tool, the computer program product comprising:
program code stored in the non-transitory computer readable storage media operable to cause a computer to provide a template type in a computer system;
wherein the template type includes a selectable template type identifier in produced in a computer user interface display of the computer system to identify the template type;
wherein template type includes template instance generation code stored in the non-transitory computer readable storage media to cause a computer to run a template instance generation process;
wherein the template type includes template instance validation code stored in the non-transitory computer readable storage media to cause a computer to run a template instance validation process;
wherein the template instance generation code is operable to cause a computer to produce in the computer system, in response to user selection of the template type identifier, a template instance that is associated with the template type;
wherein the produced template instance identifies a constraint set that includes multiple constraints and that identifies associations between the multiple constraints in the constraint set and the one or more design objects in the circuit design;
wherein the template instance validation code is operable in response to receiving notification of an event that could cause the template instance to become invalid to, invoke the validation process associated with the template instance to validate the constraints;
receiving a success indicator from the validation process, and
invoke a recovery process if the success indicator indicates that the constraints are not valid.

* * * * *